US012560865B2

(12) United States Patent
Lee et al.

(10) Patent No.: US 12,560,865 B2
(45) Date of Patent: Feb. 24, 2026

(54) RESIST COMPOUND, METHOD FOR FORMING PATTERN USING SAME, AND METHOD FOR MANUFACTURING SEMICONDUCTOR DEVICE USING SAME

(71) Applicant: Samsung Electronics Co., Ltd., Suwon-si (KR)

(72) Inventors: Jin Kyun Lee, Incheon (KR); Hyun Taek Oh, Incheon (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 624 days.

(21) Appl. No.: 17/890,409

(22) Filed: Aug. 18, 2022

(65) Prior Publication Data

US 2022/0404700 A1 Dec. 22, 2022

Related U.S. Application Data

(63) Continuation of application No. PCT/KR2021/002121, filed on Feb. 19, 2021.

(30) Foreign Application Priority Data

Feb. 19, 2020 (KR) ........................ 10-2020-0020174

(51) Int. Cl.

| | |
|---|---|
| ***G03F 7/038*** | (2006.01) |
| ***C08F 222/40*** | (2006.01) |
| ***C08F 230/04*** | (2006.01) |
| ***H01L 21/027*** | (2006.01) |
| ***H01L 21/3213*** | (2006.01) |

(52) U.S. Cl.

CPC .......... *G03F 7/038* (2013.01); *C08F 222/402* (2020.02); *C08F 230/04* (2013.01); *H01L 21/0274* (2013.01); *H01L 21/32139* (2013.01)

(58) Field of Classification Search

CPC ..... G03F 7/0042; G03F 7/0043; G03F 7/0044
See application file for complete search history.

(56) References Cited

U.S. PATENT DOCUMENTS

| | | | | |
|---|---|---|---|---|
| 5,164,286 | A * | 11/1992 | Blakeney | G03F 7/322 430/326 |
| 11,079,676 | B2 | 8/2021 | Asano et al. | |
| 2003/0013037 | A1* | 1/2003 | Lee | G03F 7/0046 430/920 |
| 2012/0107749 | A1* | 5/2012 | Tono | G03F 7/38 568/842 |
| 2016/0116839 | A1 | 4/2016 | Meyers et al. | |
| 2019/0310552 | A1 | 10/2019 | Asano et al. | |
| 2020/0041896 | A1 | 2/2020 | Moon et al. | |

FOREIGN PATENT DOCUMENTS

| | | | |
|---|---|---|---|
| JP | 2002/327017 | A | 11/2002 |
| KR | 100148622 | B1 | 2/1999 |
| KR | 101901522 | B1 | 9/2018 |
| KR | 2019/0099428 | A | 8/2019 |

OTHER PUBLICATIONS

Extended European Search Report dated Jan. 30, 2024 for corresponding European Patent Application No. 21757804.6.

Ku Ye-Jin et al: "Highly fluorinated alternating copolymers possessing high glass transition emperature and cross-linking capabilities under extreme UV radiation", Proceedings of the SPIE, SPIE, US, vol. 11612, Feb. 22, 2021 (Feb. 22, 2021), pp. 116120J-116120J, XP060139064, ISSN: 0277-786X, DOI.

Office Action issued Aug. 26, 2023 in Chinese Application No. 202180015430.9.

International Search Report dated May 27, 2021, issued in corresponding International Patent Application No. PCT/KR2021/002121.

Mia Ahokas and Carl-Eric Wilen, 'Modified and functionalized malemide copolymers for paper coatings' *Polymer Bulletin*, vol. 66, 2011, pp. 491-501.

* cited by examiner

*Primary Examiner* — Daborah Chacko-Davis
(74) *Attorney, Agent, or Firm* — HARNESS, DICKEY & PIERCE, P.L.C.

(57) ABSTRACT

Provided are a resist compound, a method of forming a pattern by using the same, and a method of manufacturing a semiconductor device using the same. According to the present disclosure, the compound may be represented by Formula 1:

Formula 1

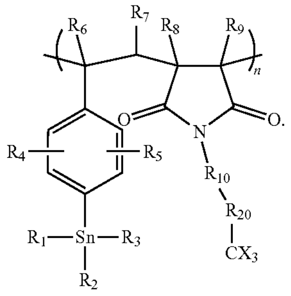

17 Claims, 6 Drawing Sheets

RESIST COMPOUND, METHOD FOR FORMING PATTERN USING SAME, AND METHOD FOR MANUFACTURING SEMICONDUCTOR DEVICE USING SAME

CROSS-REFERENCE TO RELATED APPLICATIONS

This application is a continuation of and claims priority under 35 U.S.C. § 120 and § 365(c) to PCT International Application No. PCT/KR2021/002121, which has an international filing date of Feb. 19, 2021, and which claims priority to Korean Patent Application No. 10-2020-0020174, filed on Feb. 19, 2020 in the Korean Intellectual Property Office, the entire contents of each of which are incorporated herein in their entirety by reference.

TECHNICAL FIELD

The present disclosure relates to a compound, and more particularly, to a resist compound including a copolymer used for manufacturing a semiconductor device.

BACKGROUND

Photolithography may include an exposure process and a development process. The exposure process may include irradiating light of a specific wavelength to a resist film to induce a change in a chemical structure of the resist film. The development process may include selectively removing one of an exposed portion and an unexposed portion of the resist film by using a difference in solubility between the exposed portion and the unexposed portion.

Recently, as a semiconductor device is highly integrated and miniaturized, components of the semiconductor device is required to have a micro-pitch and a micro-width. The importance of a resist compound for forming a micro-pattern has been increasing.

SUMMARY

An aspect of the present disclosure is to provide a pattern having excellent etch resistance and high sensitivity and a compound used for forming the pattern.

Another aspect of the present disclosure is to provide a compound having high absorbance with respect to extreme UV ultraviolet rays and a method of manufacturing a semiconductor device by using the compound.

Aspects of the present disclosure are not limited to the aforementioned problems, and unless otherwise stated, other aspects will be clearly understood by those skilled in the art by referring to the following description.

The present disclosure relates to a resist compound, a method of forming a pattern by using the resist compound, and a method of manufacturing a semiconductor device by using the resist compound.

According to an embodiment of the present disclosure, a compound may be represented by Formula 1:

Formula 1

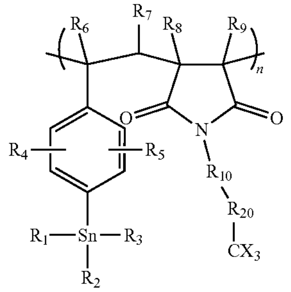

In Formula 1, $R_1$, $R_2$, $R_3$, $R_4$, $R_5$, $R_6$, $R_7$, $R_8$, and $R_9$ may each independently be one selected from hydrogen, deuterium, and a $C_1$-$C_3$ alkyl; $R_{10}$ may be a single bond, a linear $C_1$-$C_{11}$ alkyl or a branched $C_1$-$C_{11}$ alkyl; $R_{20}$ may be a $C_2$-$C_{11}$ perhalogenated alkyl or a $C_2$-$C_{11}$ perhalogenated alkyl ether perhalogenated alkyl; X may be one selected from H, F, Cl, Br, and I; and n may be an integer from 10 to 150.

In an embodiment, in Formula 1, $R_{20}$ may be represented by $C_bX_{2b}O_Z$, wherein X may be one selected from F, Cl, Br, and I; b may be an integer from 2 to 11; and z may be an integer selected from 0, 1, 2, and 3.

In one or more embodiments, in Formula 1, $R_{20}$ may be the $C_2$-$C_{11}$ perfluoroalkyl or the $C_2$-$C_{11}$ perfluoroalkyl ether perfluoroalkyl.

In an embodiment, the compound represented by Formula 1 may include a compound represented by Formula 2:

Formula 2

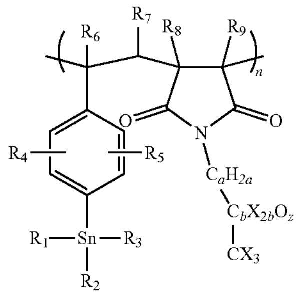

In Formula 2, X may be one selected from H, F, Cl, Br, and I; a may be an integer from 0 to 11; b may be an integer from 2 to 11; z may be an integer selected from 0, 1, 2, and 3; and n may be an integer from 10 to 150.

In an embodiment, in Formula 2, X may be F.

In an embodiment, the compound represented by Formula 1 may include a compound represented by Formula 3:

Formula 3

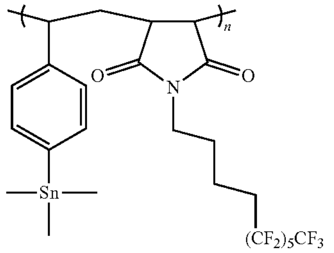

In Formula 3, n may be an integer from 10 to 150.

According to an embodiment, a method of forming a pattern may be prepared using the compound represented by Formula 1 described above.

According to an embodiment, a method of manufacturing a semiconductor device may include: forming a resist film by coating a substrate with the compound represented by Formula 1; and patterning the resist film, Formula 1

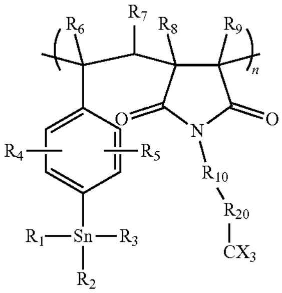

In Formula 1, $R_1$, $R_2$, $R_3$, $R_4$, $R_5$, $R_6$, $R_7$, $R_8$, and $R_9$ may each independently be one selected from hydrogen, deuterium, and a $C_1$-$C_3$ alkyl; $R_{10}$ may be a single bond, a linear $C_1$-$C_{11}$ alkyl or a branched $C_1$-$C_{11}$ alkyl; $R_{20}$ may be a $C_2$-$C_{11}$ perhalogenated alkyl or a $C_2$-$C_{11}$ perhalogenated alkyl ether perhalogenated alkyl; X may be one selected from H, F, Cl, Br, and I; and n may be an integer from 10 to 150.

In an embodiment, in Formula 1, $R_{20}$ may be represented by $C_bX_{2b}O_Z$, X may be one selected from F and I; b may be an integer from 2 to 11; and z may be an integer selected from 0, 1, 2, and 3.

In an embodiment, in Formula 1, $R_{20}$ may be the $C_2$-$C_{11}$ perfluoroalkyl, and X may be F.

In an embodiment, the patterning the resist film may include: irradiating a light on the resist film; and removing a portion of the resist film using a developing solution, wherein the light may include an electron beam or an extreme ultraviolet ray, and the developing solution may include a high fluorine-based solution.

In an embodiment, the compound represented by Formula 1 may include a compound represented by Formula 2:

Formula 2

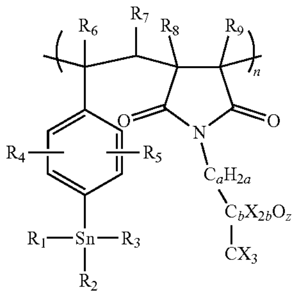

In Formula 2, X may be one selected from H, F, Cl, Br, and I; a may be an integer from 0 to 11; b may be an integer from 2 to 11; z may be an integer selected from 0, 1, 2, and 3; and n may be an integer from 10 to 150.

In an embodiment, in Formula 2, X may be F.

According to the present disclosure, a resist pattern having a narrow width and may be formed using a compound. The compound may have excellent etch resistance. The compound may also have high absorbance with respect to electron beams and/or extreme ultraviolet rays.

DETAILED DESCRIPTION

Figure 1:
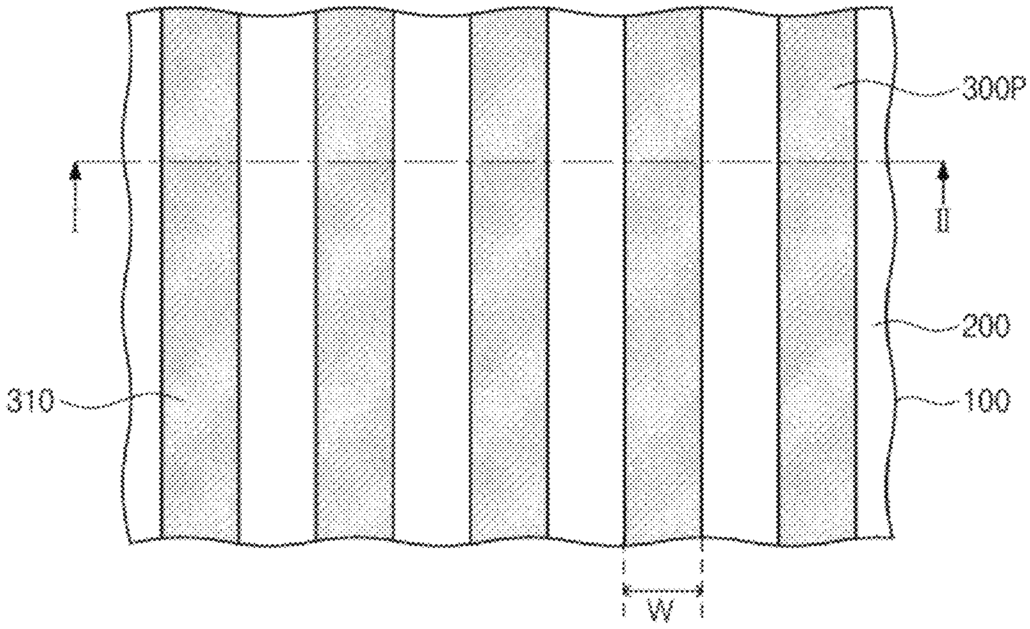
FIG. 1 is a plan view illustrating a resist pattern according to an embodiment.

In order to fully understand the configuration and effects of the present disclosure, example embodiments of the present disclosure will be described by referring to the accompanying drawings. However, the present disclosure is not limited to embodiments below, and may be implemented in various forms and various changes may be applied. However, the embodiments are provided so that the disclosure of the present disclosure is complete through the description of the embodiments, and to completely inform those of ordinary skill in the art to which the present disclosure belongs, the scope of the disclosure. Those of ordinary skill in the art will understand that inventive concepts of the present disclosure may be practiced in any suitable environment.

Terms used herein are for the purpose of describing example embodiments, and are not intended to limit the present disclosure. In the present specification, a singular form includes a plural form unless particularly defined otherwise in a sentence. The expression 'comprise' and/or 'comprising' as used herein refers that an aforementioned material, component, step, operation, and/or device does not exclude the presence of addition of one or more other substances, components, steps, operations, and/or devices.

In the present specification, the alkyl group may be a linear alkyl group, a branched alkyl group, or a cyclic alkyl group. The number of carbon atoms in the alkyl group is not particularly limited, but may be an alkyl group having 1 to 3 carbon atoms. Examples of the alkyl group include a methyl group, an ethyl group, and a propyl group, but are not limited thereto.

In the present specification, examples of halogen are fluorine (F), chlorine (Cl), bromine (Br), and iodine (I), but are not limited thereto.

In the present specification, the expression "substituted or unsubstituted" refers to unsubstitution or substitution with one or more substituents selected from the group consisting of a hydrogen atom, a deuterium atom, a halogen atom, an ether group, a halogenated alkyl group, a halogenated alkoxy group, a halogenated ether group, an alkyl group, and a hydrocarbon ring. In addition, each of the substituents provided herein may be substituted or unsubstituted. For example, an alkyl ether group may be interpreted as an ether group.

In the present specification, a perhalogenated alkyl group may include a perhalogenated alkyl ether perhalogenated alkyl group, and a perfluoroalkyl group may include a perfluoroalkyl ether perfluoroalkyl group.

Unless otherwise defined in chemical formulae of the present specification, when a chemical bond is not drawn at a position where a chemical bond is to be drawn, it may refer that a hydrogen atom is bonded to the position.

In this specification, the same reference signs may refer to the same elements throughout the description.

Hereinafter, the compound according to inventive concepts of the present disclosure will be described.

According to the present disclosure, the compound may be a resist compound. The resist compound may be used for forming a pattern or for manufacturing a semiconductor device. For example, the resist compound may be used in a patterning process for manufacturing a semiconductor device. The resist compound may be an extreme ultraviolet (EUV)-resist compound or an electron beam-resist compound. The EUV may refer to an ultraviolet ray having a wavelength in a range of about 10 nm to about 124 nm, more specifically, in a range of about 13.0 nm to about 13.9, and more specifically, in a range of about 13.4 nm to about 13.6. In an embodiment, the resist compound may be represented by Formula 1:

Formula 1

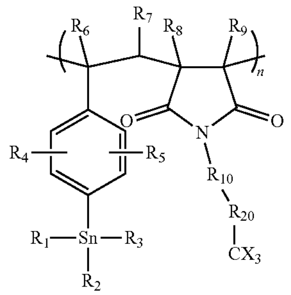

wherein, in Formula 1, $R_1$, $R_2$, $R_3$, $R_4$, $R_5$, $R_6$, $R_7$, $R_8$, and $R_9$ may each independently be one selected from hydrogen, deuterium, and a $C_1$-$C_3$ alkyl; $R_{10}$ may be a single bond, a linear $C_1$-$C_{11}$ alkyl, or a branched $C_1$-$C_{11}$ alkyl; $R_{20}$ may be a $C_2$-$C_{11}$ perhalogenated alkyl or a $C_2$-$C_{11}$ perhalogenated alkyl ether perhalogenated alkyl; X may be one selected from H, F, Cl, Br, and I; and n may be an integer from 10 to 150.

In Formula 1, X may be F or I. In some embodiments, X may be F.

In Formula 1, $R_{20}$ may be $C_2$-$C_{11}$ perfluoroalkyl or $C_2$-$C_{11}$ perfluoroalkyl ether perfluoroalkyl.

In an embodiment, in Formula 1, $R_{10}$ may be represented by $C_aH_{2a}$, and a may be an integer selected from 0 to 11.

In an embodiment, in Formula 1, $R_{20}$ may be represented by $C_bX_{2b}O_Z$; X may be one selected from F, Cl, Br, and I; b may be an integer from 2 to 11; and z may be an integer selected from 0, 1, 2, and 3.

In an embodiment, the compound represented by Formula 1 may include a compound represented by Formula 2:

Formula 2

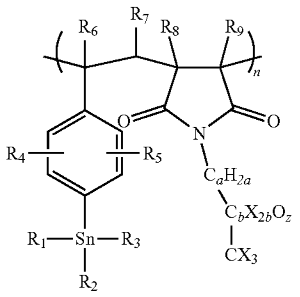

wherein, in Formula 2, X may be one selected from F, Cl, Br, and I; a may be an integer selected from 0 to 11; b may be an integer selected from 2 to 11; z may be an integer selected from 0, 1, 2, and 3; $R_1$, $R_2$, $R_3$, $R_4$, $R_5$, $R_6$, $R_7$, $R_8$, $R_9$ each independently may be selected from hydrogen, deuterium, and a $C_1$-$C_3$ alkyl; and n may be the same as defined in Formula 1.

In an embodiment, in Formula 2, X may be F or I. In one or more embodiments, X may be F.

In an embodiment, the compound represented by Formula 2 may include a compound represented by Formula 3:

Formula 3

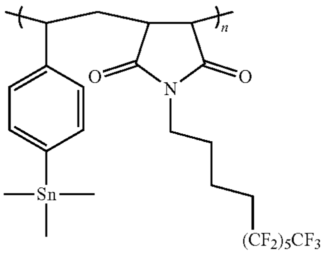

wherein, in Formula 3, n may be an integer from 10 to 150.

In an embodiment, the compound represented by Formula 2 may include a compound represented by Formula 4:

Formula 4

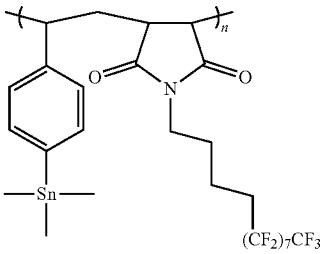

wherein, in Formula 4, n may be an integer from 10 to 150.

In the following description, the perhalogenated alkyl group may be defined as including a perhalogenated alkyl ether perhalogenated alkyl group, and the perfluoroalkyl group may be defined as including a perfluoroalkyl ether perfluoroalkyl group.

In an embodiment, the compound may include a copolymer, $C_1$-$C_{12}$ perhalogenated alkyl linked to the copolymer, and a metal atom linked to the copolymer. Accordingly, the compound may have a uniform chemical composition and a uniform chemical structure. For example, the copolymer of Formula 1 may include a first polymerization unit and a second polymerization unit. The first polymerization unit may be derived from styrene or a derivative thereof. The second polymerization unit may be different from the first polymerization unit. The second polymerization unit may be derived from maleimide or a derivative thereof. Different functional groups may be linked to each of the first polymerization unit and the second polymerization unit. For example, a first functional group may be linked to the first polymerization unit, and the first functional group may include perhalogenated alkyl. A second functional group may be linked to the second polymerization unit, and the second functional group may include a metal element such as tin. The first polymerization unit and the second polymerization unit may be alternately arranged, and thus the metal element and the perhalogenated alkyl may be uniformly distributed in the compound. When the compound represented by Formula 1 is provided in multiple numbers, a ratio of the total number of the first functional groups and a ratio of the total number of the second functional groups in a plurality of the compounds may be substantially identical to each other. Accordingly, the resist film including the compound may exhibit high resolution during the exposure process. In the development process, any one of an exposed portion and an unexposed portion of the resist film may be uniformly dissolved in a developing solution. Accordingly, a resist pattern may be formed with a micro-width (W) and a micro-pitch.

In Formula 1, $R_{20}$ may include perhalogenated alkyl, and X may include a halogen element. The resist film may exhibit improved sensitivity and improved absorbance during the exposure process by including the compound represented by Formula 1. Here, the sensitivity may refer to sensitivity to EUV rays or electron beams, and the absorbance may refer to sensitivity to EUV rays or electron beams. Accordingly, an efficiency of a method of manufacturing a semiconductor device may be improved.

In the development process of the resist film, a developing solution may include a high fluorine-based solution. In Formula 1, $R_{20}$ may include perfluoroalkyl, and X may contain fluorine. The resist film includes many of the same element (e.g., fluorine) as the element contained in the developing solution, and thus may be well dissolved in the developing solution.

In an embodiment, the compound may include a metal element, for example, tin. Accordingly, the resist film including the compound may have improved etching resistance and improved mechanical properties.

As the compound includes a copolymer and perfluoroalkyl, the compound may have a relatively high glass transition temperature. For example, the compound may have a glass transition temperature of approximately 80° C. or higher, more particularly, a glass transition temperature in a range of about 110° C. to about 150° C. Accordingly, a pattern formed by using the compound may have high durability and high stability.

Hereinafter, a method of preparing the compound according to an embodiment will be described.

The method of preparing the compound according to an embodiment may include synthesizing a first monomer, synthesizing a second monomer, and performing a polymerization reaction between the first monomer and the second monomer. The synthesizing of the first monomer may be performed as shown in Scheme 1. The first monomer may include maleimide or a derivative thereof. The first monomer may include a first functional group. For example, the first monomer may include perhalogenated alkyl or perhalogenated alkyl ether perhalogenated alkyl.

Reaction Scheme 1

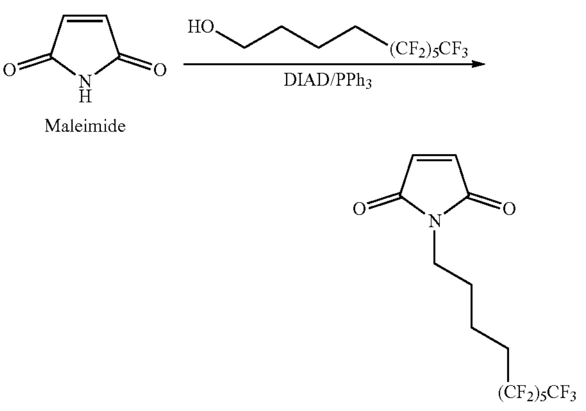

Maleimide $R_F$MI6

(wherein, in Reaction Scheme 1, DIAD represents diisopropyl azodicarboxylate, and $PPh_3$ represents triphenylphosphine.)

The synthesizing of the second monomer may be performed as shown in Scheme 2. The second monomer may include styrene or a derivative thereof. The second monomer may include a second functional group. The second functional group may include a metal element such as tin. For example, the second monomer may include tin linked to styrene or tin linked to the derivative of styrene.

Reaction Scheme 2

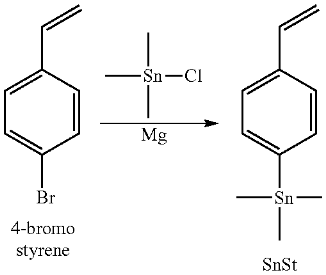

4-bromo styrene

SnSt

The performing of the polymerization reaction between the first monomer and the second monomer may be performed as shown in Reaction Scheme 3.

Reaction Scheme 3

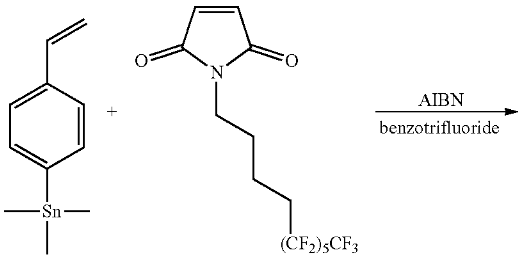

SnSt $R_F$MI6

-continued

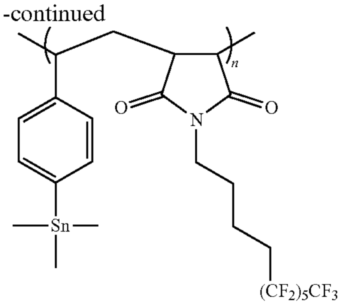

P($R_F$MI6-SnSt)

(wherein, in Reaction Scheme 3, AIBN represents azobisisobutyronitrile, and n may be an integer from 10 to 150.)

As shown in Reaction Scheme 3, a copolymer may be prepared. The copolymer may include, as described above, a first polymerization unit and a second polymerization unit. The first polymerization unit may be derived from the first monomer. The second polymerization unit may be different from the first polymerization unit, and may be derived from the second monomer. The first polymerization unit may be a polymerization unit to which perhalogenated alkyl or perhalogenated alkyl ether perhalogenated alkyl is linked. The second polymerization unit may be a polymerization unit to which a metal element such as tin is linked.

Hereinafter, a method of forming a pattern by using the compound according to an embodiment and a method of manufacturing a semiconductor device according to an embodiment will be described.

FIG. 1 is a plan view illustrating a resist pattern according to an embodiment. FIGS. 2 to 5 are views for explaining the formation of a bottom pattern according to an embodiment, and the views correspond to cross-sections taken along line II-II' of FIG. 1.

Figure 2:
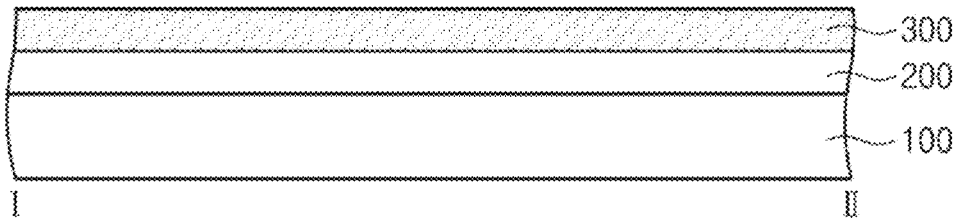
FIGS. 2 to 5 are views for explaining a method of forming a bottom pattern according to an embodiment.

Referring to FIGS. 1 and 2, a substrate 100 may be prepared. A bottom film 200 and a resist layer 300 may be sequentially formed on the substrate 100. The bottom film 200 may be a target layer to be etched. The bottom film 200 may consist of one selected from a semiconductor material, a conductive material, and an insulating material, or a combination thereof. Furthermore, the bottom film 200 may be formed as a single layer, or may include multiple layers that are stacked. Although not shown, layers may be further provided between the substrate 100 and the bottom film 200.

The compound represented by Formula 1 may be coated on the bottom film 200 to form a resist film 300. The coating of the compound may be performed by spin coating. Then, a heat treatment process may be further performed on the coated compound. The heat treatment process may be performed at a temperature in a range of about 80° C. to about 200° C. The heat treatment process may correspond to a baking process performed on the resist film 300.

Figure 3:
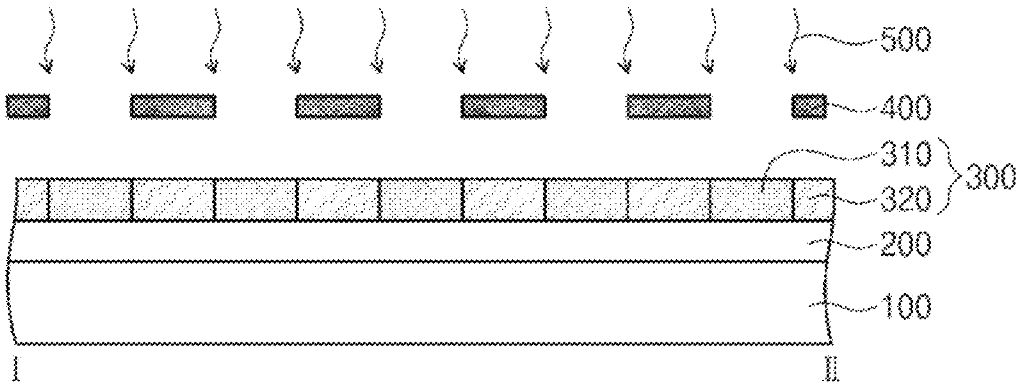

Referring to FIGS. 1 and 3, the resist film 300 may be exposed by light 500. The light 500 may be an electron beam or an extreme ultraviolet ray. Before the light 500 is irradiated, a photomask 400 may be arranged on the resist film 300. The light 500 may be irradiated onto a first portion 310 of the resist film 300 exposed by the photomask 400. When the resist film 300 is exposed to the light 500, a chemical bond of the compound represented by Formula 1 may be broken to form radicals. Such radicals may be free radicals. The compound may include halogen. For example, in Formula 1, $R_{20}$ may include C2-C11 perhalogenated alkyl or C2-C11 perhalogenated alkyl ether perhalogenated alkyl, and X may include a halogen element. In one or more embodiments, $R_{20}$ may include perfluoroalkyl or perfluoroalkyl ether perfluoroalkyl, and X may include fluorine. In this case, halogen and oxygen may have high absorbance for the electron beam and the extreme ultraviolet ray. As an amount of halogen or oxygen in the compound increases, more radicals may be formed by irradiation of the light 500. Due to the radicals, an intermolecular binding reaction between the substances of Formula 1 may occur. Accordingly, the chemical structure of the compound of the first portion 310 of the resist film 300 exposed to the light 500 may be changed.

A second portion 320 of the resist film 300 may not be exposed to the light 500. Thus, the chemical structure of a compound in the second portion 320 of the resist film 300 may not be changed. Accordingly, after completion of the irradiation of the light 500, the first portion 310 and the second portion 320 of the resist film 300 may have different chemical structures from each other. Afterwards, the photomask 400 may be removed.

Figure 4:
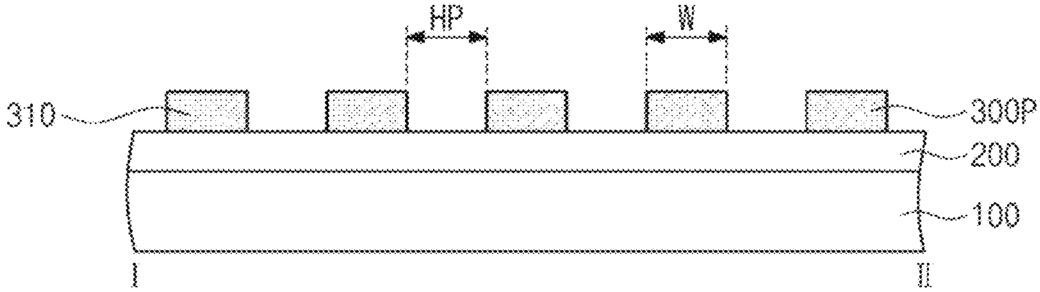

Referring to FIGS. 1 and 4, the second portion 320 of the resist film 300 may be removed by a developing solution to form a resist pattern 300P. The resist pattern 300P may be formed by a patterning process including exposure and development processes on the resist film 300. The resist pattern 300P may correspond to the first portion 310 of the resist film 300 in FIG. 3. The developing solution may include a high fluorine-based solvent and a solution containing the same. Such a high fluorine-based solution may refer to a solution containing a great amount of fluorine. For example, the developing solution may include at least one of hydrofluoroether (HFE) and perfluorocarbon (PFC). As the high fluorine-based solution is used as the developing solution, the developing solution may have a low surface tension. Accordingly, a pattern collapse of the resist pattern 300P may be limited and/or prevented during the development process. The pattern collapse may refer that a portion of the developed resist film 300 (e.g., the first portion 310) collapses due to the surface tension of the solvent while drying. The development process performed on the resist pattern 300P may be chemically stable. Accordingly, the resist pattern 300P may be formed with a micro-width W and a micro-pitch.

When the composition ratio deviation of the resist compounds increases, the resist compounds may be dissolved relatively non-uniformly in the developing solution. According to embodiments, the compound may include a copolymer, and multiple compounds may have substantially the same composition ratios to each other. The second portion 320 of the resist film 300 may have high solubility in the developing solution. During the development process, the selectivity of the second portion 320 with respect to the first portion 310 may be increased. The second portion 320 of the resist film 300 may be uniformly dissolved in the developing solution. Accordingly, the resist pattern 300P formed by the compound may have a narrow width W. For example, the resist pattern 300P may have a width W in a range of about 20 nm to about 300 nm. The resist pattern 300P formed by the compound may have a narrow half-pitch HP. For example, the resist pattern 300P may have a half-pitch HP in a range of about 20 nm to about 300 nm. The half-pitch HP may refer to an interval between two adjacent portions from among portions constituting the resist pattern 300P.

In an embodiment, the compound of Formula 1 may be a non-CAR type resist compound. For example, as described with reference to FIG. 3, the structure of the first portion 310 of the resist film 300 may be changed by light. The resist film 300 may not include a separate photoacid generator and/or a separate photoinitiator. Thus, the deformation of the shape of the resist pattern 300P due to the photoacid generator and/or the photoinitiator may be limited and/or prevented.

As shown in FIG. 1, the resist pattern 300P may have a linear planar shape. For example, the resist pattern 300P may include portions extending in one direction. However, the planar shape of the resist pattern 300P may be modified in variously shapes, such as a zigzag shape, a honeycomb shape, or a circular shape. The resist pattern 300P may expose the bottom film 200.

Figure 5:
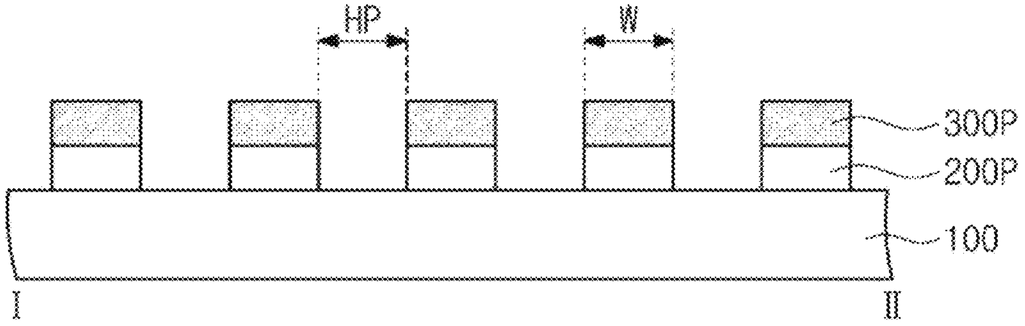

Referring to FIGS. 1 and 5, the bottom film 200 exposed from the resist pattern 300P may be removed to form a bottom pattern 200P. The removal of the bottom film 200 may be performed by an etching process. The bottom film 200 may have etch selectivity with respect to the resist pattern 300P. The bottom pattern 200P may expose the substrate 100. In one or more embodiments, the bottom pattern 200P may expose other layers arranged between the substrate 100 and the bottom pattern 200P. In an embodiment, the compound may include a metal, and the resist pattern 300P may have high etch resistance during the etching process. For example, the etch selectivity of the bottom film 200 with respect to the resist pattern 300P may be improved, so that the resist pattern 300P may not be etched during the etching process or may have a very low etch rate. In this regard, during the etching process on the bottom film 200, the shape of the resist pattern 300P may be maintained. Then, the resist pattern 300P may be removed. Accordingly, the formation of the pattern may be completed. The pattern may refer to the bottom pattern 200P. A width of the bottom pattern 200P may correspond to the width W of the resist pattern 300P. Since the resist pattern 300P has a narrow width W, the bottom pattern 200P may be also formed with a narrow width. A half-pitch HP of the bottom pattern 200P may correspond to the half-pitch HP of the resist pattern 300P. Since the resist pattern 300P has a half-pitch HP, the bottom pattern 200P may be also formed with a narrow half-pitch HP.

In an embodiment, the bottom pattern 200P may be a component of a semiconductor device. For example, the bottom pattern 200P may be a semiconductor pattern, a conductive pattern, or an insulation pattern, in a semiconductor device.

Hereinafter, by referring to Experimental Examples of the present disclosure, synthesis of compounds and preparation of resist patterns will be described.

1. Preparation of Compound (1) Synthesis of First Monomer—Reaction Scheme 1

$R_F$MI6 to which a highly fluorinated alkyl chain was introduced.

In a round flask (100 $cm^3$), triphenylphosphine ($PPh_3$, 2.70 g, 10.3 mmol) and tetrahydrofuran (THF)(25 $cm^3$) were added to prepare a solution. After stirring the solution, the solution was cooled to 0° C. To the cooled solution, diisopropyl azodicarboxylate (DIAD, 2.10 g, 10.3 mmol) was added dropwise to prepare a mixture. The mixture was stirred for 10 minutes. Then, a solution in which 5,5,6,6,7,7,8,8,9,9,10,10,10-tridecafluorodecan-1-ol (4.80 g, 12.4 mmol) was dissolved in THF (10 $cm^3$) was added to the mixture. After maintaining the mixture at 0° C. for 5 minutes, maleimide (1.00 g, 10.3 mmol) was added to the mixture to prepare a reactant. After removing the cool bath, the mixture was stirred at room temperature (25° C.) for 12 hours. After completion of the reaction, ethyl acetate was added to the reaction product, and an extraction process was performed thereon. The ethyl acetate solution in which the reaction product was mixed was washed with water and saturated sodium chloride aqueous solution. Accordingly, the organic solution in which the reaction product was dissolved was separated. Then, anhydrous $MgSO_4$ was added to the organic solution and stirred, and accordingly, the moisture in the reaction product was removed. The reaction product was filtered and then concentrated. The resulting product was purified by column chromatography (stationary phase: silica gel, mobile phase: ethyl acetate: hexane=1:4). Accordingly, a white solid as a final product ($R_F$MI6) was obtained.

[Yield Analysis]

A mass of the final product ($R_F$MI6) was about 3.50 g, and a yield thereof was analyzed to be about 72%.

[Nuclear Magnetic Resonance (NMR) Analysis]

Chemical shift values (δ) of the synthesized material measured by $^1$H NMR (400 MHz, CDCl3) were 6.71 (s, 2H), 3.56 (t, J=7 Hz, 2H), 2.19-2.00 (m, 2H), 1.75-1.58 (m, 4H).

Accordingly, it was confirmed that the final product ($R_F$MI6) thus synthesized was 1-(5,5,6,6,7,7,8,8,9,9,10,10,10-tridecafluorodecyl)-1H-pyrrole-2,5-dione corresponding to the product of Reaction Scheme 1.

(2) Synthesis of Second Monomer—Reaction Scheme 2

Synthesis of 4-trimethylstannyl styrene (SnSt) monomer to which Tin (Sn) was Introduced In a round flask (100 cm3), magnesium turning (1.20 g, 49.2 mmol) and tetrahydrofuran (THF)(5 cm3) were added to prepare a mixture. The mixture was then subjected to freeze thaw degassing to remove oxygen therefrom, and in a nitrogen atmosphere, the mixture was heated to 60° C. and stirred for 1 hour. To the resulting mixture, a solution in which 4-bromostyrene (5.00 g, 27.3 mmol) was dissolved in THF (25 cm3) was added dropwise and stirred for 1 hour. The resulting mixture was cooled down to a temperature in a range of about 0° C. to about 5° C., and then, a solution in which trimethyl tin chloride (6.50 g, 32.8 mmol) was dissolved in THF was added dropwise thereto. The reaction temperature was slowly raised, and the reaction was carried out at room temperature (25° C.) for 2 hours. After completion of the reaction, water (20 cm3) and hexane (100 cm3) were added to the reaction mixture. Then, insoluble substances in the reaction mixture were removed by a filtration process using alumina. After washing the filtrate with water and saturated aqueous sodium chloride solution, MgSO4 was added to the washed filtrate. The resulting filtrate was stirred to remove the residual moisture therefrom and to obtain a concentrated product. The concentrated product was purified by column chromatography (stationary phase: silica gel, mobile phase: hexane), thereby obtaining a final product (SnSt). Here, the final product was a colorless liquid.

[Yield Analysis]

A mass of the final product (SnSt) was about 4.5 g, and a yield thereof was analyzed to be about 62%.

[NMR Analysis]

Chemical shift values (δ) of the synthesized material measured by $^1$H NMR (400 MHz, AcetoneD) were 7.45 (dd, J=26, 7 Hz 4H), 6.73 (dd, J=18, 11 Hz, 1H), 5.81 (d, J=18 Hz 1H), 5.21 (d, J=11 Hz 1H)z 0.36-0.20 (m, 9H).

Accordingly, it was confirmed that the final product (SnSt) thus synthesized was 4-trimethylstannyl styrene corresponding to the product of Reaction Scheme 2.

(4) Comparative Example 1A—Preparation of Resist Compound (Reaction Scheme 4)

In a Schlenk tube (25 $cm^3$), the previously synthesized first monomer ($R_F$MI6) (0.40 g, 0.85 mmol), styrene (0.09 g, 0.85 mmol), and 2,2'-azobis(2-methylpropionitrile) (AIBN) (0.01 g, 0.06 mmol) were added in a nitrogen atmosphere. Then, benzotrifluoride (6 $cm^3$) treated with nitrogen gas bubbling was added to the mixture under a nitrogen gas condition. Next, by stirring the mixture at 80° C. for 12 hours, a reaction according to Reaction Scheme 4 was performed. Afterwards, hexane (100 $cm^3$) was added dropwise to the solution in the tube to form a precipitate. The precipitate was filtered and dried, so as to obtain a final product, P($R_F$MI6-St).

Reaction Scheme 4

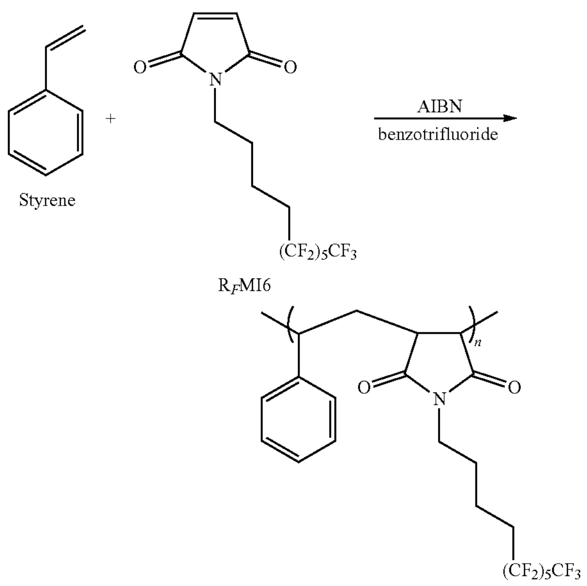

Styrene $R_F$MI6

P($R_F$MI6-St)

(wherein, in Reaction Scheme 4, n may be an integer from 10 to 150.)

[Yield Analysis]

A mass of the final product was about 0.34 g.

[Molecular Weight]

A number average molecular weight (Mn) was analyzed to be about 69,000 g/mol.

(5) Experimental Example 1A—Preparation of Compound of Formula 3 (Reaction Scheme 3)

In a Schlenk tube (25 $cm^3$), the previously synthesized first monomer (1-(5,5,6,6,7,7,8,8,9,9,10,10,10-tridecafluorodecyl)-1H-pyrrole-2,5-dione, hereinafter referred to as $R_F$MI6) (0.53 g, 1.12 mmol), the previously synthesized second monomer (4-trimethylstannyl styrene, SnSt) (0.30 g, 1.12 mmol), and 2,2'-azobis(2-methylpropionitrile) AIBN (0.01 g, 0.06 mmol) were in a nitrogen atmosphere. Then, benzotrifluoride (4 $cm^3$) treated with nitrogen gas bubbling was added into the shrink tube under a nitrogen gas condition. Next, by stirring the mixture at 80° C. for 12 hours, a reaction according to Reaction Scheme 3 was performed. Afterwards, MeOH (100 $cm^3$) was added dropwise to the solution in the tube to form a precipitate. The solution in which the precipitated was formed was filtered and dried, so as to obtain a final product, P($R_F$MI6-SnSt).

[Yield Analysis]

A mass of the final product was about 0.60 g.

[Molecular Weight]

A number average molecular weight (Mn) was analyzed to be about 36,000 g/mol.

[NMR Analysis]

Figure 6:
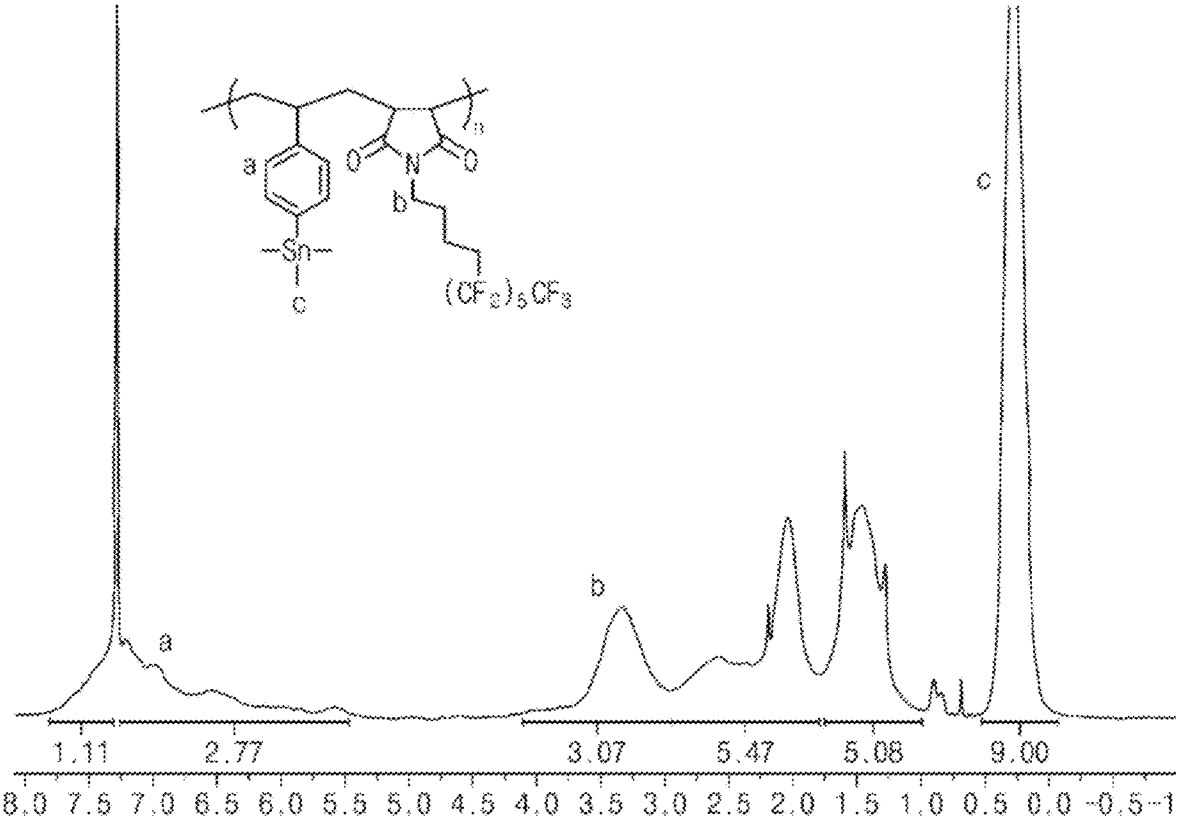
FIG. 6 shows nuclear magnetic resonance spectrum results of a product of Experimental Example 1A.

FIG. 6 shows the $_1$H NMR spectrum results of the product of Experimental Example 1A. Here, the x-axis represents δ (ppm), and the y-axis represent intensity (unit: arbitrary value, a.u.).

Referring to FIG. 6, it was confirmed that the final product, P($R_F$MI6-SnSt), was the material represented by Formula 3 corresponding to the product of Reaction Scheme 3.

(6) Comparative Example 1B—Synthesis of P($R_F$MI6-St)-R

In a Schlenk flask (25 $cm^3$), 1-(5,5,6,6,7,7,8,8,9,9,10,10,10-tridecafluorodecyl)-1H-pyrrole-2,5-dione ($R_F$MI6) (1.0 g, 2.1 mmol), styrene (0.2 g, 2.1 mmol), 4-cyano-4-(dodecylsulfanylthiocarbonyl)sulfanyl pentanoic acid (CDSTSP) (0.02 g, 0.05 mmol), and 2,2'-azobis(2-methylpropionitrile) (AIBN) (0.004 g, 0.03 mmol) were added in a nitrogen atmosphere. Then, benzotrifluoride (6 $cm^3$) treated with nitrogen gas bubbling was added to the mixture under a nitrogen gas condition. Next, by stirring the mixture at 90° C. for 12 hours, a reaction according to Reaction Scheme 5 was performed. Afterwards, the solution contained in the tube was added dropwise to hexane (100 $cm^3$) to form a precipitate. The solution in which the precipitated was formed was filtered and dried, so as to obtain a final product, P($R_F$MI6-St)-R.

Reaction Scheme 5

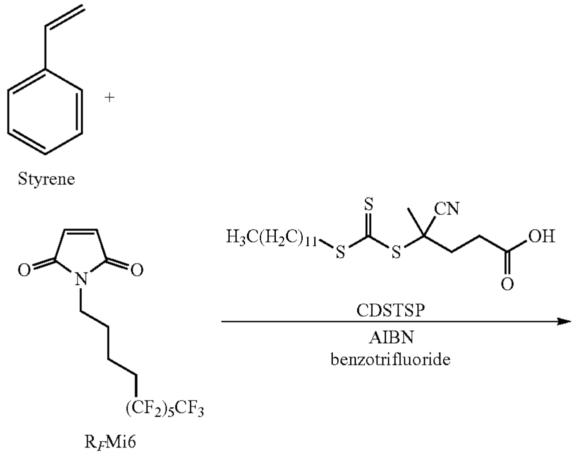

Styrene $R_F$Mi6

-continued

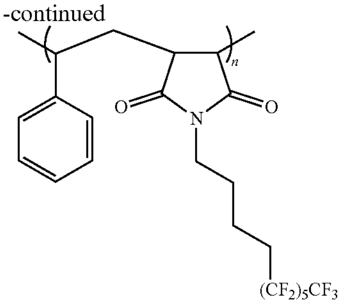

P($R_F$MI6-St)-R (wherein, in Reaction Scheme 5, n may be an integer from 10 to 150.)

[Yield analysis] A mass of the final product was about 0.8 g.

[Molecular weight] A number average molecular weight (Mn) was analyzed to be about 12,000 g/mol.

(7) Experimental Example 1B—Synthesis of P($R_F$MI6-SnSt)-R

In a Schlenk flask (25 $cm^3$), 1-(5,5,6,6,7,7,8,8,9,9,10,10,10-tridecafluorodecyl)-1H-pyrrole-2,5-dione ($R_F$MI6) (0.5 g, 1.06 mmol), 4-trimethylstannyl styrene (SnSt) (0.3 g, 1.06 mmol), 4-cyano-4-(dodecylsulfanylthiocarbonyl)sulfanyl pentanoic acid (CDSTSP) (0.01 g, 0.03 mmol), and 2,2'-azobis(2-methylpropionitrile) (AIBN) (0.0022 g, 0.01 mmol) were added in a nitrogen atmosphere. Then, benzotrifluoride (3 $cm^3$) treated with nitrogen gas bubbling was added into the tube under a nitrogen gas condition. Next, by stirring the mixture at 90° C. for 12 hours, a reaction according to Reaction Scheme 6 was performed. Afterwards, a polymer solution contained in the tube was added dropwise to MeOH (100 $cm^3$) to form a precipitate. The solution in which the precipitated was formed was filtered and dried, so as to obtain a final product, P($R_F$MI6-SnSt)-R.

Reaction Scheme 6

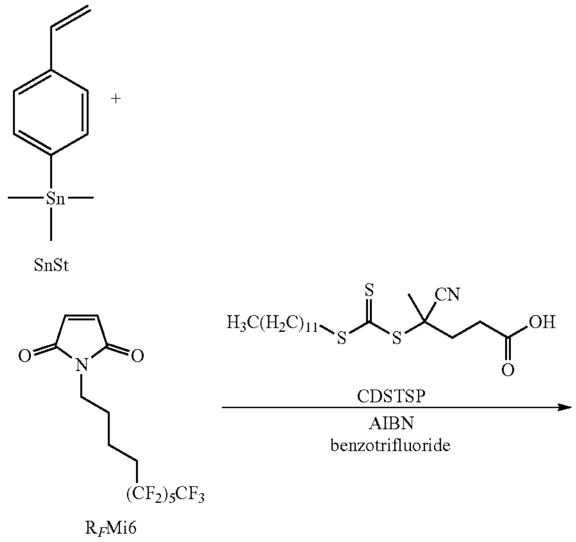

-continued

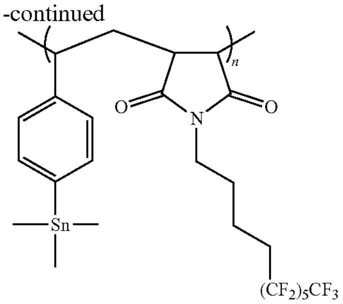

P($R_F$MI6-SnSt)-R (wherein, in Reaction Scheme 6, n may be an integer from 10 to 150.)

[Yield analysis] A mass of the final product was about 0.5 g.

[Molecular weight] A number average molecular weight (Mn) was analyzed to be about 18,000 g/mol.

(8) Comparative Example 1C—Synthesis of P($R_F$MI6-St)-R

In a Schlenk flask (25 $cm^3$), 1-(5,5,6,6,7,7,8,8,9,9,10,10,11,11,12,12,12-heptadecafluorododecyl)-1H-pyrrole-2,5-dione ($R_F$MI8, 1.0 g, 1.8 mmol), styrene (0.2 g, 1.8 mmol), 4-cyano-4-(dodecylsulfanylthiocarbonyl)sulfanyl pentanoic acid (CDSTSP, 0.02 g, 0.04 mmol), and 2,2'-azobis(2-methylpropionitrile (AIBN, 0.01 g, 0.09 mmol) were added in a nitrogen atmosphere. Then, benzotrifluoride (6 $cm^3$) treated with nitrogen gas bubbling was added to the mixture under a nitrogen gas condition. Next, by stirring the mixture at 80° C. for 12 hours, a reaction according to Reaction Scheme 7 was performed. Afterwards, the solution contained in the tube was added dropwise to hexane (100 $cm^3$) to form a precipitate. The solution in which the precipitated was formed was filtered and dried, so as to obtain a final product, P($R_F$MI8-St)-R.

Reaction Scheme 7

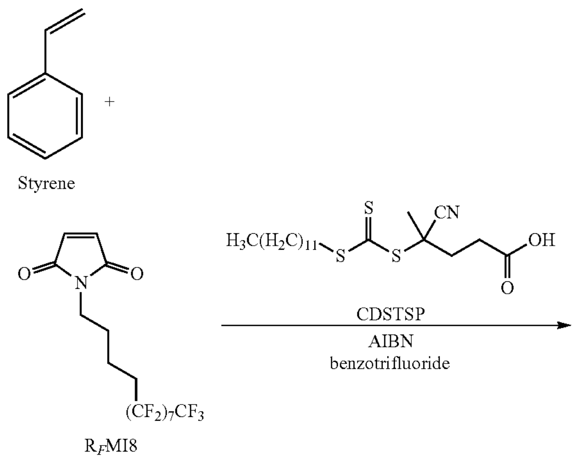

-continued

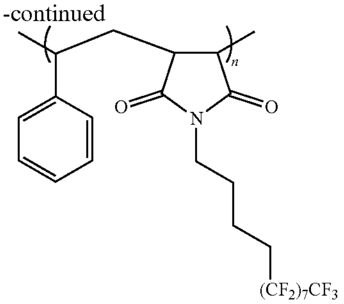

$P(R_FMI8\text{-}St)\text{-}R$ (wherein, in Reaction Scheme 7, n may be an integer from 10 to 150.)

[Yield analysis] A mass of the final product was about 0.9 g.

[Molecular weight] A number average molecular weight (Mn) was analyzed to be about 12,000 g/mol.

(9) Experimental Example 1C—Synthesis of $P(R_FMI8\text{-}SnSt)\text{-}R$

In a Schlenk flask (25 $cm^3$), 1-(5,5,6,6,7,7,8,8,9,9,10,10,11,11,12,12,12-heptadecafluorododecyl)-1H-pyrrole-2,5-dione ($R_FMI8$, 1.0 g, 1.8 mmol), 4-TrimethylStannyl Styrene (SnSt) (0.5 g, 1.8 mmol), 4-cyano-4-(dodecylsulfanylthiocarbonyl)sulfanyl pentanoic acid (CDSTSP, 0.02 g, 0.04 mmol), and 2,2'-azobis(2-methylpropionitrile) (AIBN, 0.01 g, 0.09 mmol) were added in a nitrogen atmosphere. Then, benzotrifluoride (6 $cm^3$) treated with nitrogen gas bubbling was added to the mixture under a nitrogen gas condition. Next, by stirring the mixture at 80° C. for 12 hours, a reaction according to Reaction Scheme 8 was performed. Afterwards, the solution contained in the tube was added dropwise to hexane (100 $cm^3$) to form a precipitate. The solution in which the precipitated was formed was filtered and dried, so as to obtain a final product, $P(R_FMI8\text{-}SnSt)\text{-}R$.

Reaction Scheme 8

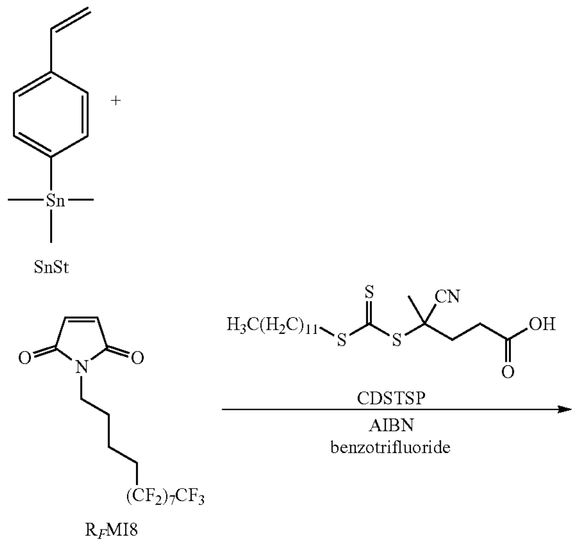

-continued

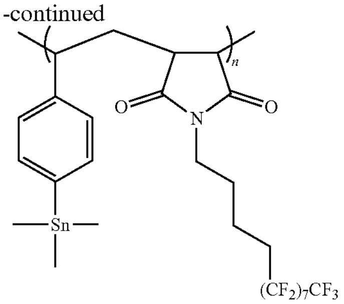

$P(R_FMI8\text{-}SnSt)\text{-}R$ (wherein, in Reaction Scheme 8, n may be an integer from 10 to 150.)

[Yield analysis] A mass of the final product was about 1.2 g.

[Molecular weight] A number average molecular weight (Mn) was analyzed to be about 15,000 g/mol.

2. Formation 1 of Resist Pattern—Lithography Using Electron Beam

Comparative Example 2A

Compound $P(R_FMI6\text{-}St)$ of Comparative Example 1A was dissolved in HFE-7600 (available from 3M Company) to prepare a resist compound solution (5 wt/vol %). The resist compound solution was spin-coated on a silicon (Si) substrate at a speed of 3,000 rpm for 60 seconds. Next, the Si substrate was heated at 130° C. for 1 minute to form a resist film (to a thickness of 100 nm). An electron beam between about 50 $\mu C/cm^2$ and about 1,000 $\mu C/cm^2$ was irradiated onto the resist film under an acceleration voltage of 80 keV. PF-7600 (available from 3M Company) was used as a developing solution to perform a development process on the resist film for 30 seconds to form a negative resist pattern.

Experimental Example 2A

Compound $P(R_FMI6\text{-}SnSt)$ of Experimental Example 1A was dissolved in PF-7600 to prepare a resist compound solution (4 wt/vol %). The resist compound solution was spin-coated on a Si substrate at a speed of 2,500 rpm for 60 seconds. Next, the Si substrate was heated at 110° C. for 1 minute to form a resist film (to a thickness of 100 nm). An electron beam between about 50 $\mu C/cm^2$ and about 1,000 $\mu C/cm^2$ was irradiated onto the resist film under an acceleration voltage of 80 keV. Then, PF-7600 was used as a developing solution to perform a development process on the resist film for 10 seconds to form a negative resist pattern.

<Comparative Example 2B> Evaluation of Electron Beam Lithography of $P(R_FMI6\text{-}St)\text{-}R$ Compound $P(R_FMI6\text{-}St)\text{-}R$ of Comparative Example 1B was dissolved in HFE-7600 (available from 3M Company) to prepare a resist compound solution (3 wt/vol %). The resist compound solution was spin-coated on a Si substrate at a speed of 3,000 rpm for 60 seconds. Next, the Si substrate was heated at 110° C. for 1 minute to form a thin film (to a thickness of about 100 nm). Afterwards, an electron beam between about 50 $\mu C/cm^2$ and about 1,000 $\mu C/cm^2$ was irradiated onto the thin film under an acceleration voltage of 80 keV. A development process using PF-7600 was performed on the resist film for 30 seconds to form a negative pattern.

<Experimental Example 2B> Evaluation of Electron Beam Lithography of P($R_F$MI6-SnSt)-R Compound P($R_F$MI6-SnSt)-R of Experimental Example 1B was dissolved in HFE-7600 (available from 3M Company) to prepare a resist compound solution (3 wt/vol %). The resist compound solution was spin-coated on a Si substrate at a speed of 3,000 rpm for 60 seconds. Next, the Si substrate was heated at 110° C. for 1 minute to form a resist film (to a thickness of about 100 nm). An electron beam between about 50 $\mu C/cm^2$ and about 1,000 $\mu C/cm^2$ was irradiated onto the resist film under an acceleration voltage of 80 keV. PF-7600 (available from 3M Company) was used as a developing solution to perform a development process on the resist film for 30 seconds to form a negative resist pattern.

<Comparative Example 2C> Evaluation of Electron Beam Lithography of P($R_F$MI8-St)-R Compound P($R_F$MI8-St)-R of Comparative Example 1C was dissolved in HFE-7600 (available from 3M Company) to prepare a resist compound solution (3 wt/vol %). The resist compound solution was spin-coated on a Si substrate at a speed of 3,000 rpm for 60 seconds. Next, the Si substrate was heated at 110° C. for 1 minute to form a resist film (to a thickness of about 100 nm). An electron beam between about 50 $\mu C/cm^2$ and about 1,000 $\mu C/cm^2$ was irradiated onto the resist film under an acceleration voltage of 80 keV. PF-7600 (available from 3M Company) was used as a developing solution to perform a development process on the resist film for 30 seconds to form a negative resist pattern.

<Experimental Example 2C> Evaluation of Electron Beam Lithography of P($R_F$MI8-SnSt)-R Compound P($R_F$MI8-SnSt)-R of Experimental Example 1C was dissolved in HFE-7600 (available from 3M Company) to prepare a resist compound solution (3 wt/vol %). The resist compound solution was spin-coated on a Si substrate at a speed of 3,000 rpm for 60 seconds. Next, the Si substrate was heated at 110° C. for 1 minute to form a resist film (to a thickness of about 100 nm). An electron beam between about 50 $\mu C/cm^2$ and about 1,000 $\mu C/cm^2$ was irradiated onto the resist film under an acceleration voltage of 80 keV. PF-7600 (available from 3M Company) was used as a developing solution to perform a development process on the resist film for 30 seconds to form a negative resist pattern.

3. Formation 2 of Resist Pattern Lithography Using Extreme Ultraviolet Ray

Comparative Example 3A

Compound P($R_F$MI6-St) of Comparative Example 1A was dissolved in PF-7600 to prepare a resist compound solution (5 wt/vol %). The resist compound solution was spin-coated on a Si substrate at a speed of 3,000 rpm for 60 seconds. Next, the Si substrate was heated at 110° C. for 1 minute to form a resist film (to a thickness of 100 nm). An extreme ultraviolet ray between about 5 $mJ/cm^2$ and about 90 $mJ/cm^2$ was irradiated onto the resist film under an acceleration voltage of 80 keV. Then, PF-7600 was used as a developing solution to perform a development process on the resist film for 30 seconds to form a negative resist pattern.

Experimental Example 3A

Compound P($R_F$MI6-SnSt) of Experimental Example 1B was dissolved in PF-7600 to prepare a resist compound solution (5 wt/vol %). The resist compound solution was spin-coated on a Si substrate at a speed of 3,000 rpm for 60 seconds. Next, the Si substrate was heated at 110° C. for 1 minute to form a resist film (to a thickness of 100 nm). An extreme ultraviolet ray between about 5 $mJ/cm^2$ and about 90 $mJ/cm^2$ was irradiated onto the resist film under an acceleration voltage of 80 keV. Then, PF-7600 was used as a developing solution to perform a development process on the resist film for 30 seconds to form a negative resist pattern.

Comparative Example 3C

Compound P($R_F$MI8-St)-R of Comparative Example 1C was dissolved in PF-7600 to prepare a resist compound solution (1.5 wt/vol %). The resist compound solution was spin-coated on a Si wafer at a speed of 4,000 rpm for 60 seconds. Next, the Si wafer was heated at 110° C. for 1 minute to form a resist film (to a thickness of 32 nm). Then, by using an METS apparatus manufactured by LBNL Company, an extreme ultraviolet ray between about 30 $mJ/cm^2$ and about 80 $mJ/cm^2$ was irradiated onto the resist film. Then, PF-7600 was used as a developing solution to perform a development process on the resist film for 30 seconds to form a negative resist pattern.

Experimental Example 3C

Compound P($R_F$MI8-SnSt)-R of Experimental Example 1C was dissolved in PF-7600 to prepare a resist compound solution (1.5 wt/vol %). The resist compound solution was spin-coated on a Si wafer at a speed of 3,000 rpm for 60 seconds. Next, the Si wafer was heated at 110° C. for 1 minute to form a resist film (to a thickness of 24 nm). Then, by using an METS apparatus manufactured by LBNL Company, an extreme ultraviolet ray between about 30 $mJ/cm^2$ and about 80 $mJ/cm^2$ was irradiated onto the resist film. Then, PF-7600 was used as a developing solution to perform a development process on the resist film for 30 seconds to form a negative resist pattern.

Table 1 shows the results of evaluating whether patterns were formed in Experimental Examples and Comparative Examples. Whether the patterns were formed was analyzed by using a scanning electron microscope.

TABLE 1

| | Resist compound | Light in exposure process | Formation of pattern | Width of pattern |
|---|---|---|---|---|
| Comparison Example 2A | P($R_F$MI6-St) | Electron beam | ○ | 300 nm |
| Experimental Example 2A | P($R_F$MI6-SnSt) | Electron beam | ○ | 300 nm |
| Comparison Example 3A | P($R_F$MI6-St) | EUV | ○ | — |
| Experimental Example 3A | P($R_F$MI6-SnSt) | EUV | ○ | — |

TABLE 1-continued

| | Resist compound | Light in exposure process | Formation of pattern | Width of pattern |
|---|---|---|---|---|
| Comparison Example 2B | P($R_F$MI6-St)-R | Electron beam | ○ | 50 nm |
| Experimental Example 2B | P($R_F$MI6-SnSt)-R | Electron beam | ○ | 50 nm |
| Comparison Example 2C | P($R_F$MI8-St)-R | Electron beam | ○ | 50 nm |
| Comparison Example 3C | P($R_F$MI8-St)-R | EUV | ○ | 30 nm |
| Experimental Example 2C | P($R_F$MI8-SnSt)-R | Electron beam | ○ | 50 nm |
| Experimental Example 3C | P($R_F$MI8-SnSt)-R | EUV | ○ | 30 nm |

Referring to Table 1 and FIG. 4, it was confirmed that, in the case of Experimental Examples 2A, 2B, 2C, 3A, and 3C, the resist pattern 300P was formed.

4. Evaluation of Sensitivity of Resist Film During Exposure Process Using Extreme Ultraviolet Ray Comparative Example 4

Compound P($R_F$MI8-St)-R of Comparative Example 10 was dissolved in a solvent to prepare a resist compound solution. The resist compound solution was spin-coated on a Si substrate. The Si substrate was heated at 110° C. for 1 minute to form a resist thin film. The resist thin film was formed to a thickness of about 44 nm. By verifying a dose on the resist thin film, an ultraviolet ray was irradiated onto the resist thin film. By performing a development process on the resist thin film, a negative resist pattern was formed.

Experimental Example 4

A negative resist pattern was formed in the substantially same manner as in Comparative Example 4. However, Compound P($R_F$MI8-SnSt)-R of Experimental Example 1C was used in Experimental Example 4 when preparing a resist compound solution. Here, the resist thin film was formed to a thickness of about 42 nm.

Table 2 shows the minimum dose required for the formation of the resist patterns of Comparative Example 4 and Experimental Example 4.

TABLE 2

| | Resist compound | Dose (mJ/cm$^2$) |
|---|---|---|
| Comparison Example 4 | P($R_F$MI8-St)-R | 16-18 |
| Experimental Example 4 | P($R_F$MI8-SnSt)-R | 12-16 |

Table 3 shows the results of evaluating sensitivity of the resist films of Comparative Example 4 and Experimental Example 4. Here, the sensitivity of the resist film was evaluated based on the minimum dose required for forming a resist pattern having a width of 30 nm and a half pitch of 30 nm.

TABLE 3

| | Resist compound | Dose (mJ/cm$^2$) |
|---|---|---|
| Comparison Example 4 | P($R_F$MI8-St)-R | 50 |
| Experimental Example 4 | P($R_F$MI8-SnSt)-R | 31 |

Referring to Table 2, it was confirmed that the minimum dose required for the formation of the resist pattern of Experimental Example 4 was smaller than that required for the formation of the resist pattern of Comparative Example 4.

Referring to Table 3, it was confirmed that the minimum dose required for the formation of the resist pattern having a micro pitch of Experimental Example 4 was smaller than that required for the formation of the resist pattern having a micro pitch of Comparative Example 4.

In an embodiment, when a resist compound included tin, and the resist compound is used to prepare a resist film, the resist film thus prepared had excellent sensitivity with respect to the extreme ultraviolet ray.

5. Dry Etching Process to Evaluate Etch Resistance (1) Comparative Example 5

Poly(methyl methacrylate) (hereinafter referred to as PMMA) was diluted with propylene glycol mono-methyl ether acetate (PGMEA) to prepare a mixture. The mixture was spin-coated on a Si substrate at a speed of 2,500 rpm for 60 seconds. Next, the Si substrate was heated at 160° C. for 1 minute to form a thin film (to a thickness of about 200 nm).

The Si substrate on which the thin film was formed was then loaded into an etching chamber. $CF_4$ gas and $O_2$ gas were mixed at a ratio of 30:1 to prepare etching gas. Then, an etching process using the etching gas was performed on the thin film for 60 seconds. During the etching process, a pressure and a voltage in the etching chamber were maintained at 50 mTorr and 50 W, respectively. Following the etching process, a step measuring device (Alph-Step D-300 manufactured by KLA-Tencor Company) was used to analyze step heights of the etched thin film. Based on the analyzed step heights, an etching rate of the thin film was calculated.

(2) Experimental Example 5

Compound P($R_F$MI6-SnSt) of Experimental Example 1A was dissolved in PF-7600 to prepare a resist compound solution (7 wt/vol %). The resist compound solution was spin-coated on a Si substrate at a speed of 2,500 rpm for 60 seconds. The Si substrate was heated at 110° C. for 1 minute to form a resist thin film. Here, the resist thin film was formed to a thickness of about 200 nm.

The Si substrate on which the resist thin film was formed was then loaded into an etching chamber. An etching process was then performed on the resist thin film for 60 seconds. Conditions for the etching process and the etching gas were set to be the same as those in Comparative Example 5. Following the etching process, a step measuring device (Alph-Step D-300 manufactured by KLA-Tencor Company) was used to calculate at etching rate of the thin film.

Table 4 shows the results of calculating the etching rates of the thin films of Comparative Example 5 and Experimental Example 5.

TABLE 4

| | Resist compound | Etching speed (nm/min) |
|---|---|---|
| Comparison Example 5 | PMMA | 68 |
| Experimental Example 5 | P($R_F$MI6-SnSt) | 45 |

Referring to Table 4, it was confirmed that the etching rate of the thin film of Experimental Example 5 was less than that of the thin film of Comparative Example 5. In an embodiment, when a resist compound included tin, and the resist compound is used to prepare a resist film, the resist film thus prepared may have excellent etch resistance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

The invention claimed is:

1. A compound represented by Formula 1:

Formula 1

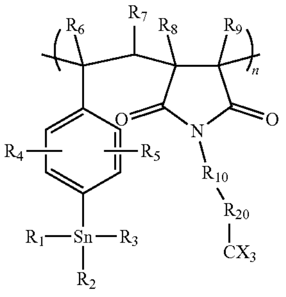

wherein, in Formula 1, $R_1$, $R_2$, $R_3$, $R_4$, $R_5$, $R_6$, $R_7$, $R_8$, and $R_9$ are each independently one selected from hydrogen, deuterium, and a $C_1$-$C_3$ alkyl, $R_{10}$ is a single bond, a linear $C_1$-$C_{11}$ alkyl, or a branched $C_1$-$C_{11}$ alkyl, $R_{20}$ is a $C_2$-$C_{11}$ perhalogenated alkyl or a $C_2$-$C_{11}$ perhalogenated alkyl ether perhalogenated alkyl, X is one selected from H, F, Cl, Br, and I, n is an integer from 10 to 150, and wherein a total number of Sn is equal to a total number of $R_{20}$.

2. The compound of claim 1, wherein, in Formula 1, $R_{20}$ is represented by $C_bX_{2b}O_Z$, wherein X is one selected from F and I, b is an integer from 2 to 11, and z is an integer selected from 0, 1, 2, and 3.

3. The compound of claim 1, wherein, in Formula 1, the $C_2$-$C_{11}$ perhalogenated alkyl or the $C_2$-$C_{11}$ perhalogenated alkyl ether perhalogenated alkyl in $R_{20}$ is a $C_2$-$C_{11}$ perfluoroalkyl or a $C_2$-$C_{11}$ perflouroalkyl ether perflouroalkyl.

4. The compound of claim 1, wherein the compound represented by Formula 1 comprises a compound represented by Formula 2:

Formula 2

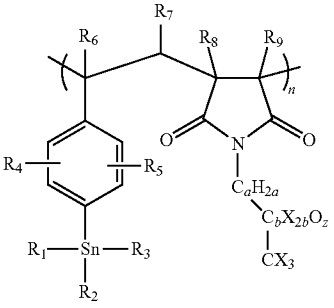

wherein, in Formula 2, $R_1$, $R_2$, $R_3$, $R_4$, $R_5$, $R_6$, $R_7$, $R_8$, and $R_9$ are each independently one selected from hydrogen, deuterium, and a $C_1$-$C_3$ alkyl, X is one selected from F, Cl, Br, and I, a is an integer selected from 0 to 11, b is an integer selected from 2 to 11, z is an integer selected from 0, 1, 2, and 3, and n is an integer from 10 to 150.

5. The compound of claim 4, wherein in Formula 2, X is F.

6. The compound of claim 1, wherein the compound represented by Formula 1 comprises a compound represented by Formula 3 or a compound represented by Formula 4:

Formula 3

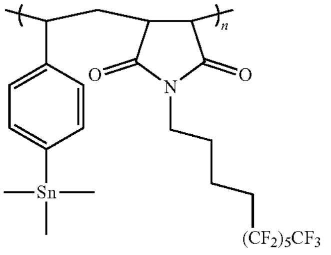

wherein, in Formula 3, n is an integer from 10 to 150,

Formula 4

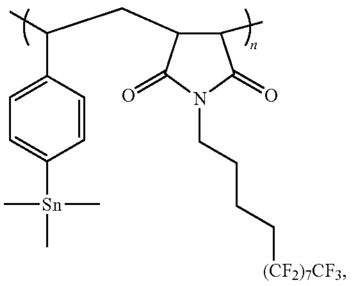

wherein, in Formula 4, n is an integer from 10 to 150.

7. The compound of claim 6, wherein the compound represented by Formula 1 comprises the compound represented by Formula 3.

8. The compound of claim 6, wherein the compound represented by Formula 1 comprises the compound represented by Formula 4.

9. A method of forming a pattern, the method comprising:

forming a film using the compound of claim 1; and patterning the film.

10. A method of manufacturing a semiconductor device, the method comprising:

forming a resist film by coating a substrate with a compound represented by Formula 1; and patterning the resist film, Formula 1

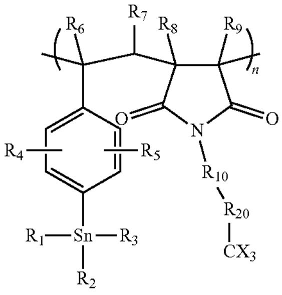

wherein, in Formula 1, $R_1$, $R_2$, $R_3$, $R_4$, $R_5$, $R_6$, $R_7$, $R_8$, and $R_9$ are each independently one selected from hydrogen, deuterium, and a $C_1$-$C_3$ alkyl, $R_{10}$ is a single bond, a linear $C_1$-$C_{11}$ alkyl, or a branched $C_1$-$C_{11}$ alkyl, $R_{20}$ is $C_2$-$C_{11}$ perhalogenated alkyl or $C_2$-$C_{11}$ perhalogenated alkyl ether perhalogenated alkyl, X is one selected from H, F, Cl, Br, and I, n is an integer from 10 to 150, wherein a total number of Sn is equal to a total number of $R_{20}$.

11. The method of claim 10, wherein, in Formula 1, $R_{20}$ is represented by $C_bX_{2b}O_Z$, X is one selected from F and I, b is an integer from 2 to 11, and z is an integer selected from 0, 1, 2, and 3.

12. The method of claim 10, wherein, in Formula 1, the $C_2$-$C_{11}$ perhalogenated alkyl or the $C_2$-$C_{11}$ perhalogenated alkyl ether perhalogenated alkyl in $R_{20}$ is a $C_2$-$C_{11}$ perfluoroalkyl, and X is F.

13. The method of claim 12, wherein the patterning of the resist film comprises:

irradiating a light on the resist film; and removing a portion of the resist film using a developing solution, wherein the light includes an electron beam or an extreme ultraviolet ray, and the developing solution includes a highly fluorinated solution.

14. The method of claim 10, wherein the compound represented by Formula 1 comprises a compound represented by Formula 2:

Formula 2

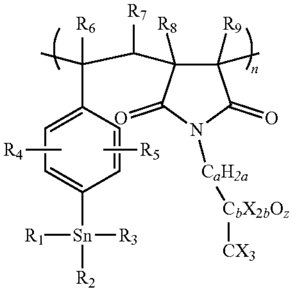

wherein, in Formula 2, $R_1$, $R_2$, $R_3$, $R_4$, $R_5$, $R_6$, $R_7$, $R_8$, and $R_9$ are each independently one selected from hydrogen, deuterium, and a $C_1$-$C_3$ alkyl, X is one selected from F and I, a is an integer selected from 0 to 11, b is an integer selected from 2 to 11, z is an integer selected from 0, 1, 2, and 3, and n is an integer from 10 to 150.

15. The method of claim 14, wherein in Formula 2, X is F.

16. The method of claim 14, wherein the compound represented by Formula 2 comprises a compound represented by Formula 3:

Formula 3

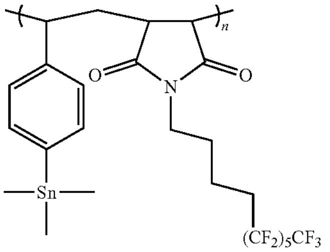

wherein, in Formula 3, n is an integer from 10 to 150.

17. The method of claim 14, wherein the compound represented by Formula 2 comprises a compound represented by Formula 4:

Formula 4

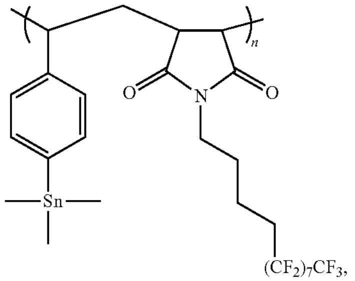

wherein, in Formula 4, n is an integer from 10 to 150.

* * * * *